United States Patent [19]

Busca et al.

[11] 4,326,174
[45] Apr. 20, 1982

[54] PASSIVE MASERS HAVING ALTERNATELY OPERATED OSCILLATOR AND CAVITY CONTROL LOOPS

[75] Inventors: Giovanni Busca, Neuchatel; Helmuth-Hugo Brandenberger, Sugiez, both of Switzerland

[73] Assignee: Ebauches S.A., Switzerland

[21] Appl. No.: 119,139

[22] Filed: Feb. 5, 1980

[30] Foreign Application Priority Data

Mar. 9, 1979 [FR] France ................ 79 06105

[51] Int. Cl.³ .............................................. H03L 7/26
[52] U.S. Cl. .................................... 331/3; 331/94.1
[58] Field of Search ..................................... 331/3, 94

[56] References Cited

U.S. PATENT DOCUMENTS 4,122,408 10/1978 Walls ........................................ 331/3

OTHER PUBLICATIONS

Walls, "Design and Results From a Prototype Passive Hydrogen Maser Frequency Standard", Proceedings of P.T.T.I., 1976, pp. 369–380.
Walls et al. "A New Kind of Passively Operating Hydrogen Frequency Standard", Proc. 30th Annual Symposium on Frequency Control, 2-4 Jun. 1976, pp. 473–480.

*Primary Examiner*—Siegfried H. Grimm
*Attorney, Agent, or Firm*—Allegretti, Newitt, Witcoff & McAndrews

[57] ABSTRACT

The invention, which may be used in particular as a frequency standard, seeks to avoid disturbance in the control action in respect of the cavity 10 by a powerful parasite signal due to the line of stimulated emission. Control of the cavity and control of the oscillator 1 on the line of stimulated emission control in a shared-time mode. A control circuit 40 acts on the carrier by way of a programmable synthesizer 43, the carrier than assuming the successive values $\omega_+$, $\omega_H$, $\omega_-$, $\omega_H$, $\omega_+$, etc. in stages. $\omega_H$ is centered on the line of stimulated emission; $\omega_+$ and $\omega_-$ which are symmetrically shifted interrogate the flanks of the emission line. By means of a signal INH, the control circuit 40 periodically suppresses the output of an active filter 42 and thus interrupts the detection action used for controlling the cavity, during the periods in which $\omega_Q$ is equal to $\omega_+$ or $\omega_-$. This detection action occurs only when $\omega_Q = \omega_H$, and after a damping dead time.

12 Claims, 5 Drawing Figures

PASSIVE MASERS HAVING ALTERNATELY OPERATED OSCILLATOR AND CAVITY CONTROL LOOPS

BACKGROUND OF THE INVENTION

The present invention concerns a passive maser and a process for controlling a passive maser, wherein a first error signal represents the difference between the carrier frequency of an injected signal and the frequency of the stimulated emission and is used to adjust the carrier frequency of the injected signal, while a second error signal represents the difference between the resonance frequency of the cavity and the carrier frequency of the injected signal, and is used to adjust the resonance frequency of the cavity. By virtue of its excellent frequency stability, such a maser is particularly suitable for forming a frequency standard.

A maser of this kind is known, in particular from the article by F. L. Walls: Proceeding of P.T.T.I. 1976, pages 369–380. A detailed description of this maser will be given hereinafter so as clearly to show the limitations thereof and to provide for full understanding of the present invention. It will suffice to mention here that a maser of this kind operates correctly only insofar as the two control loops or circuits are indeed independent.

The inventors have analyzed the extent to which the two control circuits are actually independent. They found that the cavity resonance frequency control circuit did not interfere with the injected interrogation signal carrier frequency control circuit but that, on the other hand, the latter circuit which is sensitive to the very narrow line of the stimulated emission, caused a parasite signal to be introduced into the error signal of the circuit for controlling the cavity, the parasite signal completely destroying the correct error signal. The inventors have verified this fact experimentally and have found a theoretical explanation for this phenomenon.

The object of the present invention is to prevent the error signal of the cavity control circuit being interfered with by the parasite signal of the interrogation signal frequency control circuit.

BRIEF SUMMARY OF THE INVENTION

According to the present invention in one aspect, there is provided a process for controlling a passive maser having a resonant cavity which contains a medium capable of stimulated emission, and which is excited by an injected signal, comprising the steps of producing from a signal picked off from the cavity a first error signal representing the difference between the carrier frequency of the injected signal and the frequency of the stimulated emisson, using the first error signal to adjust the said carrier frequency, producing from the picked-off signal a second error signal representing the difference between the resonance frequency of the cavity and the said carrier frequency, and using the second error signal to adjust the resonance frequency, wherein production of the second error signal is periodically inhibited and that the first error signal is produced only during the inhibition periods.

According to the present invention in another aspect, there is provided a passive maser comprising a resonant cavity containing a medium capable of stimulated emission, means for injecting into the cavity a signal with a carrier frequency substantially equal to the natural frequency of the stimulated emission, means responsive to a signal which is picked off from the cavity to produce a first error signal representing the difference between the said carrier frequency and the frequency of the stimulated emission, means responsive to the first error signal for adjusting the said carrier frequency, means responsive to the signal picked off from the cavity to produce a second error signal representing the difference between the resonant frequency of the cavity and the said carrier frequency, means responsive to the second error signal to adjust the resonance frequency of the cavity, means periodically inhibiting the means which produce the second error signal; and means for producing, during the inhibition periods, a shift in the frequency of excitation of the cavity alternately in one direction and in the opposite direction.

The invention makes it possible to provide a passive maser having a degree of stability which is markedly better than that of a conventional passive maser such as that described in the above-cited article.

BRIEF DESCRIPTION OF THE DRAWING

The invention will be described in more detail, by way of example, with reference to the accompanying drawings, in which.

DETAILED DESCRIPTION OF THE PREFERRED EMBODIMENT

Figure 1:
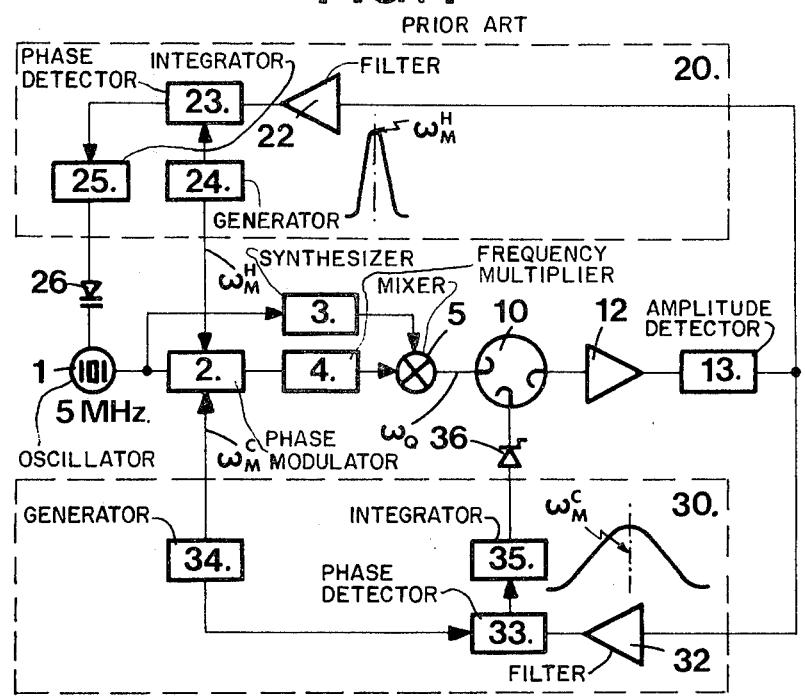
FIG. 1 is a block diagram of a known maser.

FIG. 1 is a diagrammatic view of a known maser similar to that described in the above-cited article. An oscillator 1 produces a signal at a frequency of 5 MHz. This signal is modulated in a phase modulator 2 at a first frequency $\omega_m^H$, typically 0.3 Hz, which is produced by a first generator 24, and a second frequency $\omega_m^C$, typically 12 kHz, which is produced by a second generator 34. The modulated signal is applied to a frequency multiplier 4. The 5 MHz signal is also applied to a synthesizer 3 and the outputs of the multiplier 4 and the synthesizer 3 are applied to a mixer 5 which provides a signal having a carrier frequency $\omega_Q$ which is close to 1420 MHz, which is introduced into the cavity 10.

The resonant cavity 10 is tuned to the natural frequency $\omega_H$ of the stimulated emission of the medium which it contains. In the case of a hydrogen maser, the transition which gives rise to the stimulated emission is the transition from the state F=1, $m_F$=0 to the state F=0, $m_F$=0, of a hydrogen atom which is placed in a magnetic field for separating the Zeeman sub-levels $m_F$= +1 and $m_F$= −1 from the state F=0. The natural frequency $\omega_H$ of this transition is in the region of 1420 MHz (1420.405751 . . . MHz).

The cavity 10 can be considered as a band pass filter whose coefficient $Q_c$ varies between 5000 and 50,000, depending on the volume of the cavity. For a coefficient of the order of 30,000, the cavity with the medium which it contains can be considered as a combination of such a filter with a filter having a quality factor $Q_H$ of the order of $10^9$.

An amplifier 12 receives and amplifies a signal which is detected in the cavity. This signal is rectified by an amplitude detector 13 which supplies an envelope signal which reproduces all the fluctuations in amplitude of the signal taken off in the cavity. The envelope signal is applied on the one hand to the control means 20 of the oscillator 1 and on the other hand to the control means 30 of the cavity 10.

In the control means 20 of the oscillator 1, the signal supplied by the amplitude detector 13 is applied to a filter 22 which essentially passes the frequencies which are close to the first modulation frequency $\omega_m^H$, in this case 0.3 Hz, of the generator 24. The filtered signal is applied to a phase detector 23 whose other input is connected to the generator 24 so as to provide for synchronous detection which makes is possible to detect if the carrier frequency $\omega_Q$ of the cavity interrogation signal is indeed centered on the natural frequency $\omega_H$ of the stimulated emission. Any frequency shift results in an error signal at the output of the phase detector 23. The error signal is applied to an integrator 25 and used for controlling a variable capacitor 26 which is coupled to the oscillator 1, whereby its frequency may be slightly varied.

In the control means 30 of the cavity 10, the envelope signal is received by a filter 32 which essentially passes the components which are close to the second modulation frequency $\omega_m^C$, in the present case this being about 12 kHz. The filtered signal is applied to a phase detector 33 for synchronous detection, the other input of the phase detector being connected to the second generator 34 for receiving the second modulation frequency therefrom. The error signal produced by the phase detector 33 indicates a shift in the resonance frequency of the cavity 10 with respect to the carrier frequency $\omega_Q$. The error signal which is subjected to processing by the integrator 35 is used for controlling a variable capacitor 36 which is coupled to the cavity 10, whereby the resonance frequency $\omega_C$ thereof may be slightly varied for correction purposes.

In summary, in a maser of this kind, the phase-modulated signal, at frequencies $\omega_m^H$ (0.3 Hz) and $\omega_m^C$ (12 kHz), respectively interrogates the line of the stimulated emission from the hydrogen and the resonance curve of the cavity in order respectively to provide for control of the oscillator by the stimulated emission and control of the resonance frequency of the cavity by the carrier frequency $\omega_Q$ derived from the oscillator. The adverse effects of "cavity pulling" are virtually eliminated in this maser.

A maser of this kind represents the known state of the art which the inventors took as their basic starting point. Control of this maser is satisfactory to the extent that the two loops or circuits are indeed independent. The inventors have observed that in actual fact this desired independence was not the case. The inventors discovered that the control circuit of the cavity did not cause interference with the control circuit of the oscillator, but that, on the contrary, the latter circuit which is sensitive to the very narrow stimulated emission line introduced a very powerful parasitic signal into the error signal of the second circuit, the parasitic signal completely destroying the correct error signal.

The inventors carried out the following experiment in order to provide proof in support of this conclusion:

(A) A single modulation action is effected at a time, and it is verified that one and other of the two control circuits operates correctly, separately. In particular, it was found that the difference ($\omega_C - \omega_Q$) between the resonance frequency ($\omega_C$) of the cavity and the carrier frequency $\omega_Q$ produced from the oscillator could be kept at a relative value of less than $10^{-9}$ in the long-term region (of the order of $10^4$ seconds).

(B) It is verified that the circuit for controlling the oscillator, with respect to the stimulated emission line or line H, also operates correctly in the presence of modulation in respect of the second control circuit, which second circuit however remains open.

(C) The two circuits are both closed and it is found that tuning of the cavity moves away from the line H by virtue of undesirable effects which are found to occur in the cavity control circuit.

It was verified that the circuit for controlling the oscillator on the line H produced a powerful amplitude-modulated (AM) parasite signal at the frequency of modulation $\omega_m^C$ of the circuit for controlling the cavity, even when the cavity was tuned. In addition, this signal is phase-modulated at the modulation frequency $\omega_m^H$ used for interrogating the line H.

By suppressing the interrogation modulation in respect of the line H and moving the carrier frequency $\omega_Q$ away from the frequency of the line H, it was found that the amplitude-modulated parasite signal was produced by a high-frequency signal interacting with the line H. The phase of the amplitude-modulated signal suffers an abrupt change of 180° when the carrier frequency $\omega_Q$ is allowed to pass across the line H.

The inventors have proposed a simplified theoretical interpretation of their observations.

If a signal is presented to the entrance of the empty cavity, said signal essentially comprising a carrier $\omega_Q$ and two side bands which are 180° out of phase and which are symmetrical with respect to the frequencies $\omega_Q + \omega_m$ and $\omega_Q - \omega_m$, $\omega_Q$ being very close to the resonance frequency of the cavity $\omega_C$, the cavity control circuit produces an error signal of the following form:

$$E = A_o \epsilon + D_o S \tag{1}$$

in which:

$$\epsilon = (A_+ - A_-) \cos \omega_m t + (D_+ - D_-) \sin \omega_m t \tag{2}$$

$$S = (D_+ - D_-) \cos \omega_m t - (A_+ + A_-) \sin \omega_m t \tag{3}$$

In these equations, the expressions $A_o$, $A_+$, $A_-$ represent absorption of the cavity at different frequencies:

$A_+ = A; (\omega_Q + \omega_m)$
$A_o = A; (\omega_Q)$
$A_- = A; (\omega_Q - \omega_m)$ absorption in dependence on frequency corresponding to the following equation:

$$A(\omega) = \frac{\Gamma^2}{\Gamma^2 + (\omega - \omega_C)^2} \tag{4}$$

in which $\Gamma$ is the half-width of the resonance curve.

The expressions $D_o$, $D_+$, $D_-$ represent the dispersion of the cavity at the respective frequencies $\omega_Q$, $\omega_Q + \omega_m$, $\omega_Q - \omega_m$, dispersion corresponding to the following equation:

$$D(\omega) = \frac{\Gamma(\omega - \omega_C)}{\Gamma^2 + (\omega - \omega_C)^2} \tag{5}$$

If hydrogen atoms which are capable of stimulated emission are introduced into the cavity, the expressions $A_o$ and $D_o$ in equation (1) must be modified in accordance with the following substitutions:

$$A_\sigma \rightarrow A_o + A_H \quad (6)$$

$$D_\sigma \rightarrow D_o + D_H \quad (7)$$

in which $A_H$ represents the gain due to the presence of the hydrogen atoms, and $D_H$ represents the associated dispersion.

Substitution equation (6) simply implies a change in the importance of the term $(A_o + A_H)\epsilon$ of the cavity error signal.

On the contrary, the effect of substitution (7) is that in term $(D_o + D_H) \cdot S$, dispersion $D_H$ is completely dominant. Indeed the ratio $D_H/D_o$ is as follows:

$$\frac{D_H}{D_o} = \frac{Q_H}{Q_C} \left( \frac{\omega_Q - \omega_H}{\omega_Q - \omega_C} \right) \quad (8)$$

The result of this is that $D_H$ is several orders of magnitude higher than $D_o$. Typically, $D_H/D_o = 1 \cdot 10^{+4}$ for $\omega_Q - \omega_H = 0.3 \cdot 2\pi$
RAD/sec and $\omega_Q - \omega_C = 1 \cdot 2\pi$
RAD/sec.

The effect of modulation at low frequency $\omega_m{}^H$ on the carrier may be considered as a frequency fluctuation which causes the carrier periodically to pass across the line H: the result of this is that $D_H$ periodically changes in sign at the same rhythm, which produces periodic switching of the phase of the AM parasite signal.

Theoretically, after synchronous detection and integration, the parasite signal should therefore be cancelled and should make it possible to regain the small correct error signal; however, as the parasite signal is several orders of magnitude greater than the correct signal, this would impose requirements in regard to precise symmetry in respect of the synchronous detector and the integrator, which are totally impossible to achieve.

From this the inventors therefore concluded that the two simultaneous circuits cannot be made sufficiently independent and that the control arrangement does not operate correctly.

Figure 2:
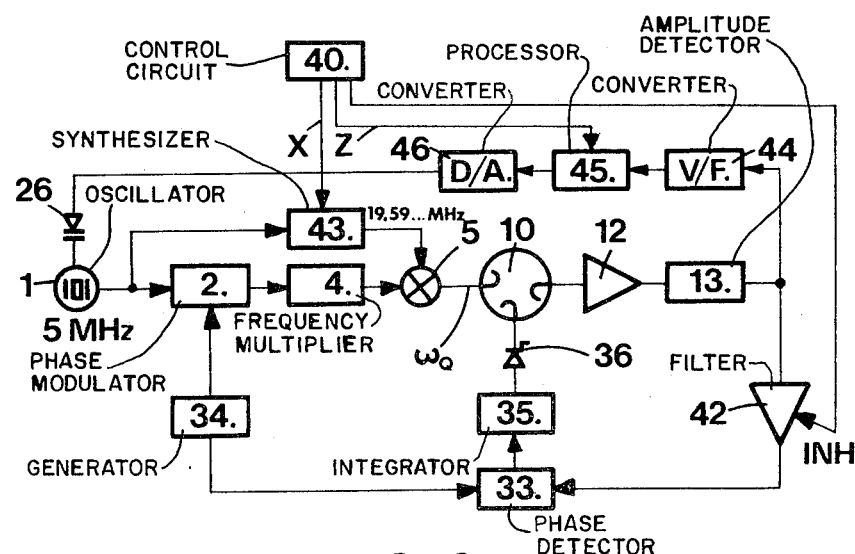
FIG. 2 is a block diagram of an illustrative maser embodying the invention.

The present invention overcomes this disadvantage by utilizing a maser with a shared-time operating mode, FIG. 2 giving a diagrammatic view of an embodiment of such a maser. The maser according to the invention comprises a certain number of components which are similar to those of the maser shown in FIG. 1, and such components are therefore denoted by the same reference numerals.

The synthesizer 3 shown in FIG. 1 is replaced by a programmable synthesizer 43 whose output frequency is in the region of 19.59 . . . MHz. This frequency is applied to the mixer 5 where it is mixed with the frequency of about 1440 MHz provided by the multiplier 4, to give a carrier frequency $\omega_Q$ which is in the region of 1420 MHz.

The output frequency of the programmable synthesizer 43 depends on the digital signals from a control circuit 40 by way of a line X. Any variation in the output frequency of the synthesizer results in an equal variation in the carrier frequency $\omega_Q$. The circuit 40 can therefore modify the carrier frequency $\omega_Q$ in order to interrogate the line H.

Figure 3:
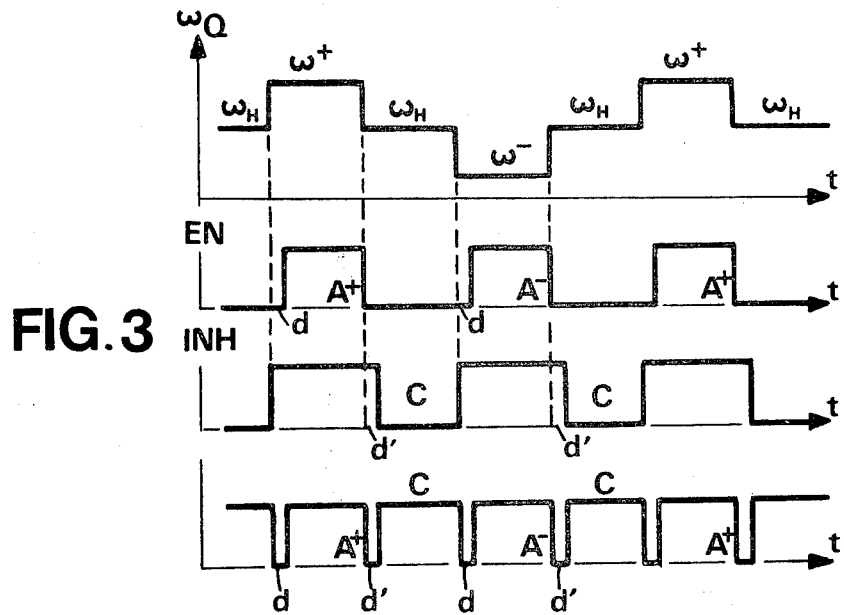
FIG. 3 shows the mode of operation of the maser shown in FIG. 2, by means of time graphs.
Figure 4:
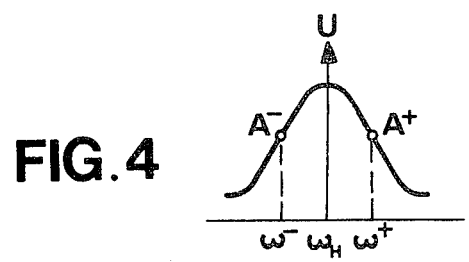
FIG. 4 shows the line of the stimulated emission.

The circuit 40 is so arranged that the carrier frequency $\omega_Q$ behaves as shown in FIG. 3 and successively assumes the indicated values $\omega_+$, $\omega_H$, $\omega_-$, $\omega_H$, $\omega_+$, etc., $\omega_H$ being the central frequency of the line H and $\omega_+$ and $\omega_-$ being the frequencies which are displaced on respective sides of frequency $\omega_H$ so as preferably to conincide with the lateral points of inflection of the curve U of the line H shown in FIG. 4. The difference between $\omega_+$ and $\omega_-$ is of the order of 1 Hz. $A^+$ and $A^-$ here denote the values of the response curve of the line H for the frequencies $\omega_+$ and $\omega_-$ respectively.

The carrier frequency $\omega_Q$ of the interrogation signal is thus shifted by discrete values alternately in one direction and in the opposite direction, each displaced stage being preceded by and followed by a stage during which the frequency is maintained at its central value. The central stage and the displaced stages are of substantially the same duration which is typically of the order of 10 seconds.

For the detection operation, the envelope signal supplied by the amplitude detector 13 is applied to a voltage-frequency converter 44 of a conventional type, which produces a train of logic pulses at a frequency proportional to the amplitude of the input signal. These pulses are applied to a digital processing circuit 45. A detailed description of an embodiment of such a circuit will be given hereinafter with reference to FIG. 5. For the moment, we shall simply indicate that, under the control of the circuit 40, it performs the following functions:

When $\omega_Q = \omega_+$ or $\omega_Q = \omega_-$, the output pulses of the converter 44 are counted for a given period of time. The results is a number representing $A^+$ if $\omega_Q = \omega_+$ and $A^-$ if $\omega_Q = \omega_-$. These numbers are put into memory. The respective counting periods are shown at the second line in FIG. 3. FIG. 3 also shows that a dead time d, of the order of 2 seconds, is provided for damping transitory phenomena.

The circuit 45 then forms the difference D between the measured number, for example $A^+$, and the memorized number, for example $A^-$, which had been measured in the prceding period, the sign of D being inverted in each period so as to produce the following:

$D = A^+ - A^-$ if $A^+$ has just been measured, or $D = (A^- - A^+)$ if $A^-$ has just been measured.

The difference produced is applied to an accumulator for carrying out numerical integration. The numerical value obtained is converted into voltage in a digital-analog converter 46 and applied to the variable capacitor 26 in order to correct the frequency of the oscillator for it to be controlled by the line H.

The cavity control circuit operates in accordance with the principle shown in FIG. 1.

For the detection operation, the envelope signal supplied by the amplitude detector 13 is applied to an active filter 42 whose output is applied to the phase detector 33 which also receives the frequency of the generator 34 in order to effect synchronous detection. The output signal of the phase detector 33 is applied to the integrator 35 whose output is connected to the variable capacitor 36 to correct the resonance frequency of the cavity 10 for it to be controlled by the carrier $\omega_Q$.

The active filter 42 comprises an input for an inhibition signal INH originating from the control circuit 40. The effect of this signal is to suppress the output signal of the active filter 42. As shown by the third line in FIG. 3, the signal INH is active and consequently the output signal of the filter 42 is suppressed, during the periods in which $\omega_Q=\omega_+$ and $\omega_Q=\omega_-$, that is to say, during the periods for measuring A+ and A−. The output signal of the filter 42 is therefore present only during the intermediate phases C when $\omega_Q=\omega_H$, a short dead time d' being provided for damping the transitory phenomena following the abrupt change in $\omega_Q$.

Thus, the measurements A+ and A− and the variations in frequencies $\omega_Q=\omega_{30}$ and $\omega_Q=\omega_-$ do not interfere with the control action in respect of the cavity.

Obviously, during the periods of time in which the output of the filter 42 is suppressed, regulation of the cavity continues to operate as the integrator 35 acts as a memory preserving the value of the regulating voltage.

The essential feature of the mode of operation of the maser according to the invention is shown in the last line of FIG. 3, which illustrates and summarizes the shared-time operating mode in respect of the two control circuits. The periods C during which control in respect of the cavity is fully in operation alternate with the periods for measuring A+ and A−, which are used for controlling the oscillator to the line H.

It will be appreciated that many variations may be made in the above-described maser without thereby departing from the basic principles of the invention. In particular, certain functions of the circuits 40 and 45 and even certain functions of the programmable synthesizer 43 could advantageously be performed by a microprocessor circuit. Consequently, the circuits described hereinafter are only given by way of example, intended solely to give a complete description of an actual embodiment.

Figure 5:
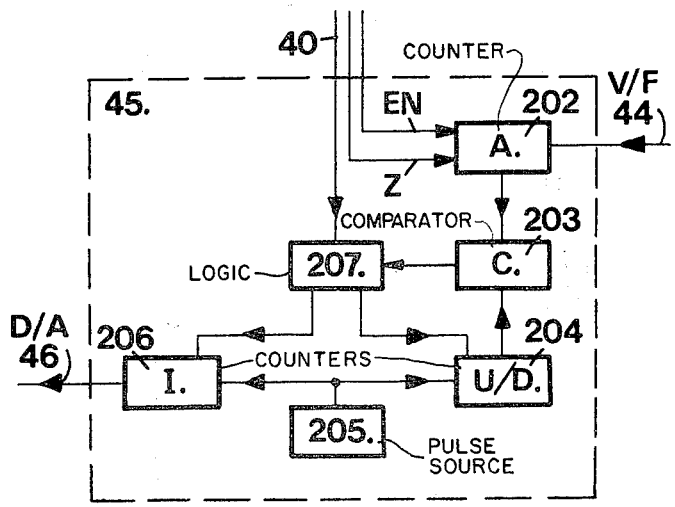
FIG. 5 shows a processing circuit forming part of the maser according to FIG. 2.

As has been seen hereinbefore, the processing circuit 45 receives a train of logic pulses from the voltage-frequency converter 44. Referring to FIG. 5, these pulses are applied to a counter 202. The counter also receives a counting control signal EN (enable) originating from the control circuit 40; this signal is shown in the second line in FIG. 3. It also receives from the circuit 40 by way of the line Z a zero resetting pulse at the beginning of each counting period.

The counter 202 is connected to a comparator 203 to which an up-down counter 204 is also connected. A circuit 205 supplies counting pulses to the up-down counter 204 and to a second up-down counter 206. A logic circuit 207 controlled by the control circuit 40 receives the data from the comparator 203, such data indicating which of the counters 202 and 204 contains the highest number, and also indicating any state of equality. In dependence on such data and in dependency on control signals from the control circuit 40, the logic circuit 207 supplies the up-down counters 204 and 206 with direction counting signals (counting up or counting down) and signals for authorizing counting of the pulses supplied by the circuit 205.

The assembly of the circuits 202 to 206 is so arranged as to operate in the following manner:

In response to the signal EN, the counter 202 counts the pulses for the given periods A+ and A− which correspond to the periods during which $\omega_Q$ is equal to $\omega_+$ or $\omega_-$, with also a small delay d intended for damping transient phenomena. In addition, at the beginning of each measuring period A+ or A−, a pulse on the line Z initially sets the counter 202 to zero. At the end of a measuring period A+ or A−, the counter 202 therefore has a numerical content which represents the value of A+ or A−.

Calculations are then carried out as follows: Pulses are passed from the circuit 205 to the up-down counter 204 and counted up (or counted down, depending on the direction of the difference between the numbers in the counters 202 and 204) until the comparator 203 indicates that there is a state of equality. It follows that the up-down counter 204 alternately assumes values A+ and A−.

However, the pulses which have been counted up or counter down by the counter 204 represent the difference D between a measurement (A+ or A−) and the preceding measurement (A− or A+ respectively). These pulses are at the same time either counted up or counted down in the counter 206, but with a counting direction which is not necessarily the same as that in respect of the counter 204. The counting direction in the counter 206 is controlled by the logic circuit 207 and it is the same as that of the counter 204 if A+ was measured, and the opposite direction if A− was measured. These differences are therefore accumulated in the counter 206, two opposite successive differences being accumulated in the same direction in the counter 206 by virtue of the action of the logic circuit 207. Consequently, the counter 206 numerically integrates the difference between A+ and A− that its numerical content therefore represents a value which can be used for correcting the frequency of the oscillator. This numerical content is applied to the converter 46 which produces the necessary control voltage.

While a preferred embodiment of the invention has been shown and described in some detail, it will be understood that this description and the accompanying drawing are offered merely by way of example, and that various changes and modifications may be made without departing from the spirit of the invention as particularly defined in the following claims.

What is claimed is:

1. A process for controlling a passive maser having a resonant cavity which contains a medium capable of stimulated emission, and which is excited by an injected signal, comprising the steps of producing from a signal picked off from the cavity a first error signal representing the difference between the carrier frequency of the injected signal and the frequency of the stimulated emission, using the first error signal to adjust the said carrier frequency, producing from the picked-off signal a second error signal representing the difference between the resonance frequency of the cavity and the said carrier frequency, and using the second error signal to adjust the resonance frequency, wherein production of the second error signal is periodically inhibited and that the first error signal is produced only during the inhibition periods.

2. A process according to claim 1, wherein during the inhibition periods, the carrier frequency of the injected signal is shifted alternately in one direction and in the opposite direction symmetrically, and that the first error signal is produced by determining the differences between the resulting amplitudes of the signal picked off from the cavity.

3. A process according to claim 2, wherein the shifting of the carrier frequency is effected by discrete values.

4. A process according to claim 3, wherein the inhibition periods are of substantially the same duration as the periods during which the second signal is produced.

5. A process according to claim 4, wherein the said duration is of the order of 10 seconds.

6. A process according to claim 3, 4 or 5 wherein the difference between the two shifted frequencies is of the order of 1 Hz.

7. The process according to any of claims 2 to 5, wherein the carrier frequency is alternately shifted in one direction during one inhibition period and in the opposite direction during the following inhibition period.

8. A process according to any of claim 2 to 5, wherein the production of the first error signal is effected by converting the signal picked off from the cavity into a train of pulses at a frequency proportional to the amplitude of the signal; counting the pulses in each inhibition period for a given duration; integrating the successive differences of the pulse counts; and converting the result of the integration operation into a voltage which forms the first error signal and which is used for adjusting the carrier frequency of the injected signal.

9. A process according to claim 8, wherein each counting step begins only after a dead time which permits damping of transient phenomena.

10. A passive maser comprising a resonant cavity containing a medium capable of stimulated emission, means for injecting into the cavity a signal with a carrier frequency substantially equal to the natural frequency of the stimulated emission, means responsive to a signal which is picked off from the cavity to produce a first error signal representing the difference between the said carrier frequency and the frequency of the stimulated emission, means responsive to the first error signal for adjusting the said carrier frequency, means responsive to the signal picked off from the cavity to produce a second error signal representing the difference between the resonant frequency of the cavity and the said carrier frequency, means responsive to the second error signal to adjust the resonance frequency of the cavity, means periodically inhibiting the means which produce the second error signal; and means for producing, during the inhibition periods, a shift in the frequency of excitation of the cavity alternately in one direction and in the opposite direction.

11. A maser according to claim 10, wherein the means effecting shifting of the cavity excitation frequency comprise a programmable frequency synthesizer.

12. A maser according to claim 10 or 11, wherein the means producing the first error signal comprises a voltage-frequency converter to which the signal picked off from the cavity is applied, after rectification, for supplying a train of output pulses having a frequency representing the amplitude of the said signal picked off from the cavity; circuits for counting the output pulses of the converter in each inhibition period for a given duration; means for integrating the successive differences between the numbers produced by the counting circuits; and a digital to analog converter connected to the output of the integration means and whose output signal forms the first error signal.

* * * * *